United States Patent [19]

Lampe et al.

[11] 4,035,628

[45] July 12, 1977

[54] ANALOG TRANSVERSAL FILTERING AND CORRELATION WITH PROGRESSIVE SUMMATION OF ANALOG SIGNALS

[75] Inventors: Donald Ross Lampe, Ellicott City; Marvin Hart White, Laurel, both of Md.

[73] Assignee: Westinghouse Electric Corporation, Pittsburgh, Pa.

[21] Appl. No.: 625,691

[22] Filed: Oct. 24, 1975

[51] Int. Cl.² ................. H03K 5/159; G11C 11/40
[52] U.S. Cl. ........................ 235/193; 235/181; 307/221 D; 328/167; 333/70 T
[58] Field of Search ............... 235/193, 181, 156; 328/165, 167; 333/18, 28 R, 70 T; 325/42, 65; 250/211 J; 357/24; 307/221 D

[56] References Cited

U.S. PATENT DOCUMENTS

| 3,809,923 | 5/1974 | Esser ........................... 328/167 X |
| 3,940,602 | 2/1976 | Lagnado et al. ............... 357/24 X |
| 3,942,035 | 3/1976 | Buss ............................. 328/167 X |
| 3,946,247 | 3/1976 | Collins et al. ................ 307/221 D |

OTHER PUBLICATIONS

White et al.-"Characterization of Surface Channel CCD Image Arrays at Low Light Levels"-IEEE Journal of Solid State Circuits, Feb. 1974—pp. 1-13.

*Primary Examiner*—Joseph F. Ruggiero
*Attorney, Agent, or Firm*—H. W. Patterson

[57] ABSTRACT

"Progressive summation" of analog signals with a parallel-in/serial-out (P/I/SO) CCD structure replaces the conventional "simultaneous summation" of analog signals in serial-in/parallel-out (SI/PO) structured systems. Gain non-uniformities presented by buffer circuits and caused in part by threshold non-uniformities are avoided; on-chip power consumption is reduced, thereby avoiding a source of further exaggeration of gain non-uniformities of buffer circuits. Transversal filtering and correlation systems in accordance with the invention accordingly are achieved with these problems of prior art circuits avoided. Reduced power consumption on-chip also maintains more reasonable and constant operating temperature levels, avoiding deleterious effects of temperature increases on dynamic range of CCD systems due to leakage current levels which sharply increase with increased temperature, contributing noise and reducing the maximum charge potential of the CCD wells available for signal.

20 Claims, 29 Drawing Figures

OUTPUT IMPULSE RESPONSE OF TRANSVERSAL FILTER
FOR UNIFORM WEIGHTING

OUTPUT IMPULSE RESPONSE OF TRANSVERSAL FILTER
FOR LINEARLY INCREASING WEIGHTS

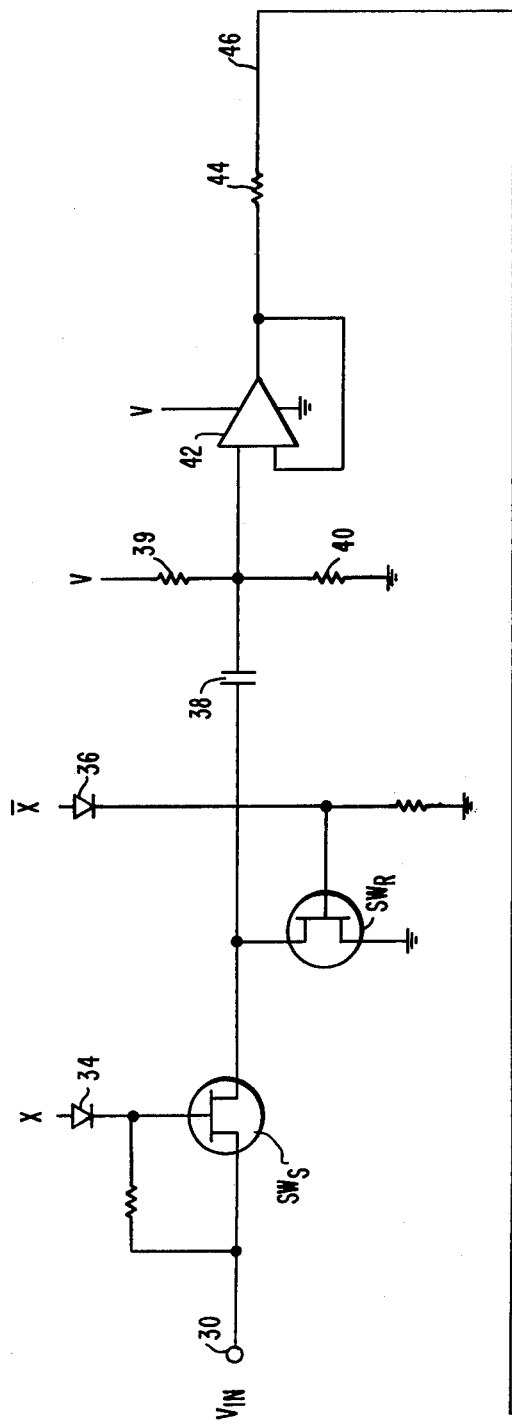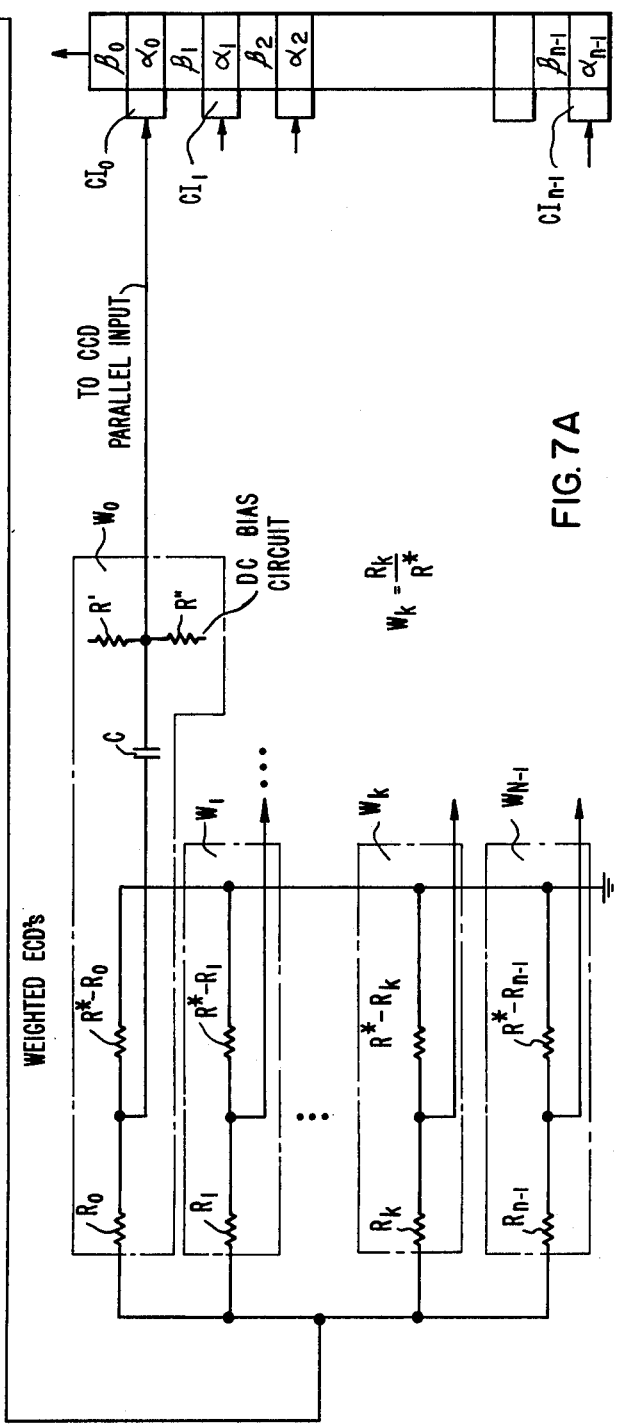
FIG. 7A
$W_k = \dfrac{R_k}{R^*}$

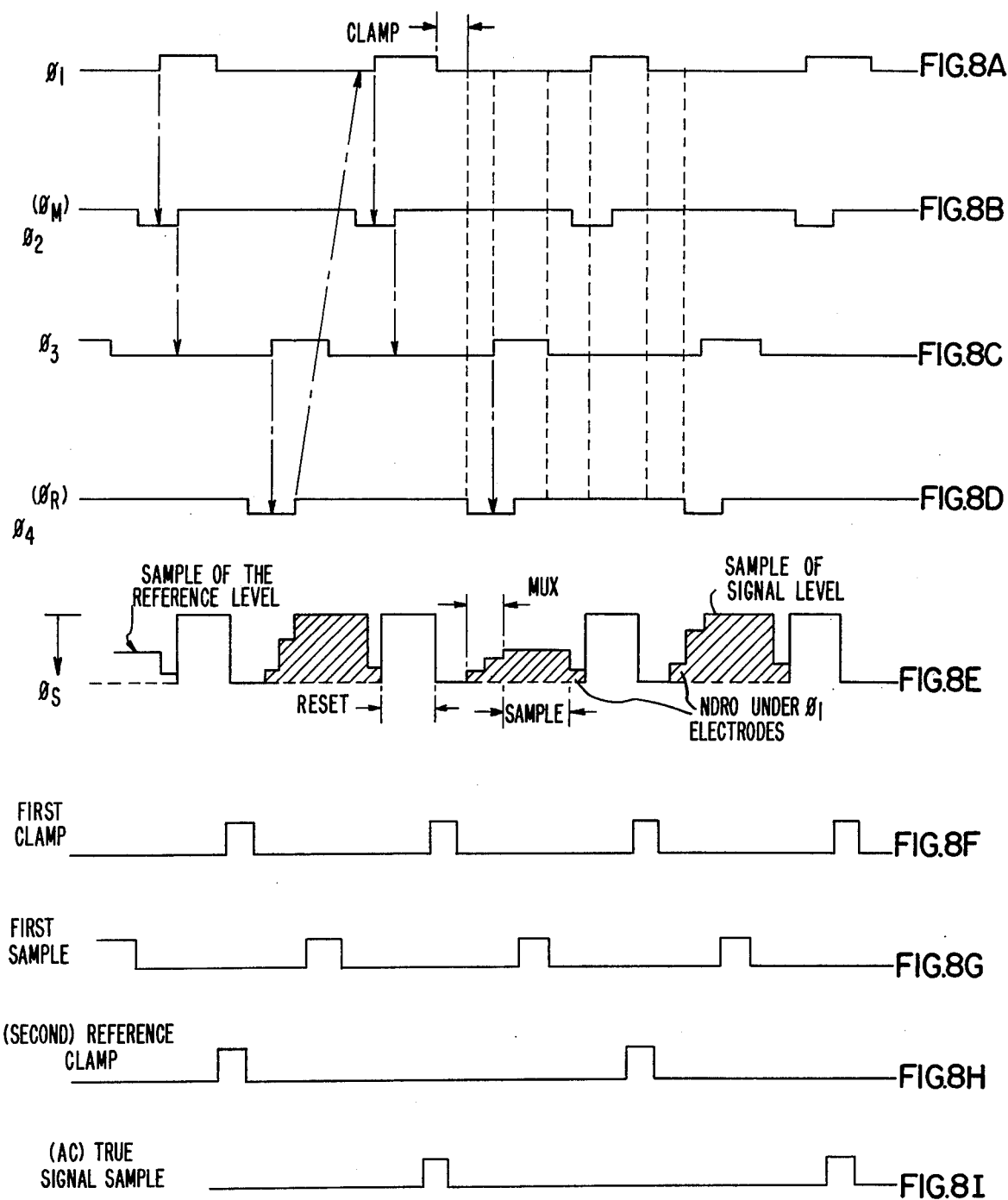

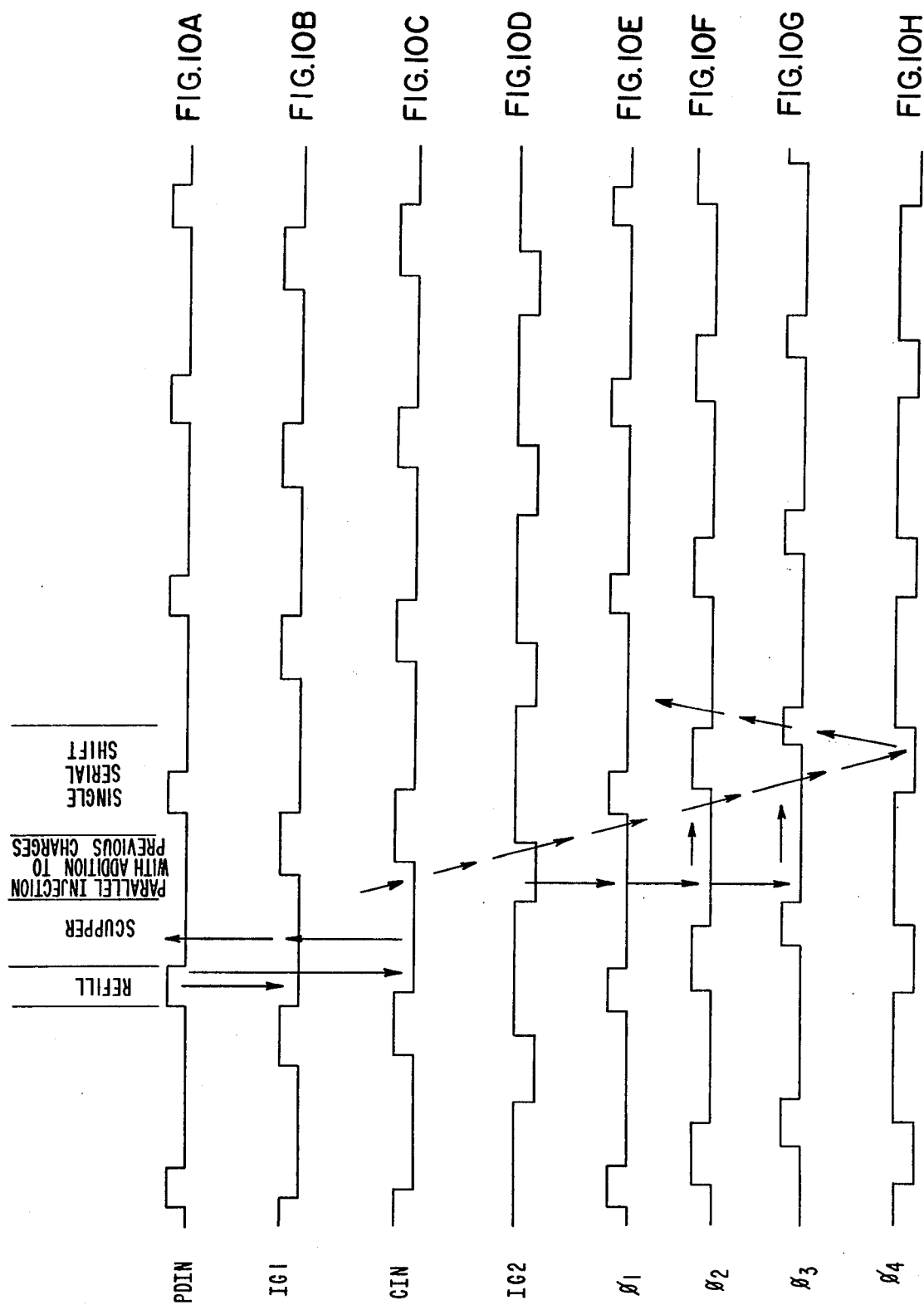

ANALOG TRANSVERSAL FILTERING AND CORRELATION WITH PROGRESSIVE SUMMATION OF ANALOG SIGNALS

BACKGROUND OF THE INVENTION

This invention relates to CCD systems and, more particularly, to a technique of progressive summation of analog signals in CCD systems as may be utilized for implementing correlators and transversal filters.

STATE OF THE PRIOR ART

In the prior art, digital signal processing (DSP) has been utilized in many applications in view of the low cost of the integrated circuits that are available to perform many functions in digital fashion. As compared with analog techniques, DSP has been preferred in that its use of digital implementation has been considered to be preferable in view of cost, weight, flexibility and accuracy considerations. By contrast, the only present advantage of analog techniques is its lower power consumption, which advantage may gradually disappear as technology advances. A further technique known as discrete analog signal processing (DASP) provides an alternative to the aforementioned methods of signal processing and is implemented by sampling at regular intervals an analog signal to provide a series of analog signals or samples, each of which may be operated upon one-at-a-time and have an amplitude containing information on data corresponding to M digital bits, where one bit of resolution in DSP in equivalent to 6dB dynamic range in the analog signal. Experiments have shown that a signal-charge analog packet can be shifted through a typical CTD nearly unattenuated, limited by the size of the holding wells and the minimum detectable output signal.

As more fully described in an article entitled, "Charge Coupled Semiconductor Devices" appearing in *Bell System Technical Journal*, April 1970 by W. S. Boyle and G. E. Smith, CCD'S sample an analog input signal to provide a series of analog bits to be stored in potential wells created at the surface of a semiconductor and transported along the surface by timing or signals. More particularly, these charges constitute minority carriers stored at the silicon-silicon dioxide interface of MNOS non-memory capacitors and are transferred from capacitor or well to capacitor or well on the same substrate by manipulating the voltages applied across the capacitor.

The present invention relates to the use of such CCD technology. Certain special CCD techniques are useful in the implementation of the system of the present invention and, accordingly, are noted briefly at this juncture.

U.S. Pat. No. 3,781,574 — White et al, assigned to the common assignee, discloses a coherent sampled read-out circuit and signal processor. In one embodiment disclosed in the patent, this circuit and processor are coupled to a CCD shift register. In fact, the circuit and processor of the patent have applicability to any type of device from which an analog charge signal readout is to be obtained, for purposes of minimizing the degradation of the readout signal and minimizing any noise contribution due to the readout operation. The term coherent sampling as employed in that patent corresponds to a term employed herein of "correlated double sampling" (CDS). The technique of the U.S. Pat. No. 3,781,574 relates principally to output operations and hence may be applied to any system producing an analog charge output such as diode arrays, and CTD, including CCD, systems.

The present invention, moreover, relates to a technique termed "Extended Correlated Double Sampling" (ECDS) which is a form of error correction for correcting voltage drift and bias errors occurring both at the input and output and within a charge transfer device itself, i.e., as structured between its input and output circuitry.

An early suggestion for achieving cancellation of bias errors and drift consistent with the techniques of extended correlated double sampling is provided in an article entitled, "An Electrically Programmable LSI Transversal Filter for Discrete Analog Signal Processing" (DASP) by Lampe et al, published in Proceedings, CCD Applications Conference 18–20, September 1973, San Diego. Calif.

U.S. patent application Ser. No. 507,115, filed Sept. 18, 1974, entitled A PROGRAMMABLE ANALOG TRANSVERSAL FILTER, of Lampe et al and assigned to the common assignee hereof discloses in somewhat greater detail, both as to theory and implementation, a system performing extended correlated double sampling (ECDS). It will be understood that ECDS provides for correction of voltage drift and bias errors, and therein including such sources of error as threshold non-uniformities across device arrays. Threshold non-uniformities and leakage current non-uniformities, of course, have effects similar to a bias error and, in effect, the output signal errors are indistinguishable as between originating from bias errors or threshold and leakage current non-uniformities.

ECDS techniques are more fully disclosed and developed in the application of Lampe et al filed concurrently herewith, Ser. No. 625,694, entitled EXTENDED CORRELATED DOUBLE SAMPLING FOR CHARGE TRANSFER DEVICES, and assigned to the common assignee hereof, the last referenced application being a continuation-in-part of the above referenced application Ser. No. 507,115 of Lampe et al.

It has also been known heretofore to operate CCD devices in a serial-in/parallel-out (SI/PO) configuration to provide "simultaneous summation" of analog signals. A particular prior application of such a technique occurs in use of CCD devices as transversal filters and correlators. An example thereof is shown in FIG. 1 of the drawings wherein an input signal sample $e_{in}$ is serially input to a succession of delay stages $\tau$ which may represent successive groups of storate potential wells of a CCD shift register channel. Parallel sensing of the potentials of the wells is performed, with the output signals supplied through a plurality of corresponding processor circuits for multiplicative weighting. As indicated in FIG. 1, these weights are designated $W_o, W_1, \ldots W_{N-1}$ for a system having N delay stages, each of $\tau$ delay. Finally, an output summer, designated by "$\Sigma$" sums the weighted, successively delayed signal samples to produce the resultant output $e_{out}$. This circuit of FIG. 1, therefore, serves to illustrate a basic configuration of transversal filters and correlators of the prior art, and particularly wherein the CCD device is arranged as a SI/PO structure.

The configuration of the prior art SI/PO arrangement of FIG. 1 presents numerous undesirable characteristics, or problems. For example, each of the parallel outputs from the CCD delay stages $\tau$ includes buffer circuits, along with the signal processing circuits for the multiplicative weighting of the samples. These buffer circuits, by their inherent configuration, have gain non-uniformities, caused in part by threshold non-uniformities. Moreover, where a monolithic device is desired, including the CCD delay stages, or channel, along with the buffer circuits, the buffer circuits result in undesirably high power consumption on-chip. The power consumption causes a temperature increase with resultant exaggeration of the gain non-uniformities. Perhaps of greater significance is that the increasing chip temperature results in a decrease of the dynamic range of the CCD, particularly resultant from increased leakage current, the latter being highly temperature dependent. As a result, the noise level of the system itself is increased, due in large part to the fact that the maximum charge potential of the CCD wells is not available for signal content but, rather, is used up by the leakage currents.

The present invention is directed to overcoming these defects and problems of prior art configurations and particularly such configurations of CCD's as may be employed in transversal filters and correlators.

SUMMARY OF THE INVENTION

The present invention comprises a new technique of "progressive summation" of analog signals with a parallel-in/serial/out (PI/SO) CCD structure. The technique of the invention finds special application in implementing transversal filters and correlators with CCD technology. In an illustrative implementation of the invention, an input signal is supplied in parallel through off-chip weighting circuits, the outputs of the weighting circuits to be supplied in parallel for injection into corresponding, additive stages of a CCD shift register channel. The shift register channel includes a plurality of stages arranged in a shift register configuration with charge injection circuits for injecting the weighted signal samples into the respective stages. The input signal is applied in parallel through a plurality of weighting circuits which may be designated, respectively, $W_0, W_1, \ldots W_{N-1}$, for a CCD shift register having N stages, each introducing a delay factor of $\tau$. An initial signal sample, therefore, is weighted in parallel and injected in parallel into the corresponding N shift register stages. The CCD shift register stages have the capability of simultaneously having a charge transferred thereto and having a charge injected therein, with the resultant stored charge being the summation thereof. It is this feature which is utilized in the "progressive summation" technique of the invention. Particularly, successive signal samples are supplied at the rate $\tau$ of simultaneous shifting of stored charges from present, to respectively next successive stages of the shift register. Accordingly, the N parallel weighted values of the next successive signal sample are injected (with the exception of the first stage) into stages presently storing the weighted sample value of the next preceding signal sample, as weighted by the next preceding weighting circuit. The N parallel weighted values of the further successive signal samples as well are injected in parallel into the corresponding shift register stages. Each stage thus sums the presently injected weighted signal value with the sum of weighted signal values currently being transferred thereto from a next preceding stage. Hence, there is obtained as the final output of the CCD shift register, i.e., from the last stage thereof, an output voltage result which may be written as:

$$e_{out}(t) = \sum_{k=0}^{N-1} W_k e_{in}(t - k\tau) \tag{1}$$

where $W_k$'s are the weights, $N$, the number of weights, and $\tau$, the unit delay.

This Equation (1) will be recognized as the conventional equation expressing a sampled filtering function or correlation function and, in fact, expresses the results of the simultaneous summation technique of the prior art.

It is to be recognized, however, that the system of the invention achieves this result through progressive summation performed in a PI/SO CCD system. This configuration permits elimination of non-destructive tapping with associated power dissipation and non-uniformities incurred in a PO configuration, while affording additional advantages of ease of fabrication and increased frequency response. Of particular significance is the absence of any buffering circuits, on-chip, for receiving the delayed, parallel outputs from the CCD configuration of the prior art, and hence the elimination of the on-chip power consumption of such buffers, as experienced in the prior art configuration.

The present invention may also be implemented in a system utilizing either or both of the techniques of CDS and ECDS as discussed above.

BRIEF DESCRIPTION OF THE DRAWINGS

FIG. 7A is a more detailed circuit schematic of the arrangement of FIG. 4;

FIGS. 8A through 8I are waveforms for explaining the operation of the circuit of FIG. 7;

FIGS. 10A through 10H comprise operating waveforms for the SCI and CCD shift channel for explaining TDI operation with parallel charge injection to perform EDCS;

DETAILED DESCRIPTION OF THE PREFERRED EMBODIMENT

Figure 1:
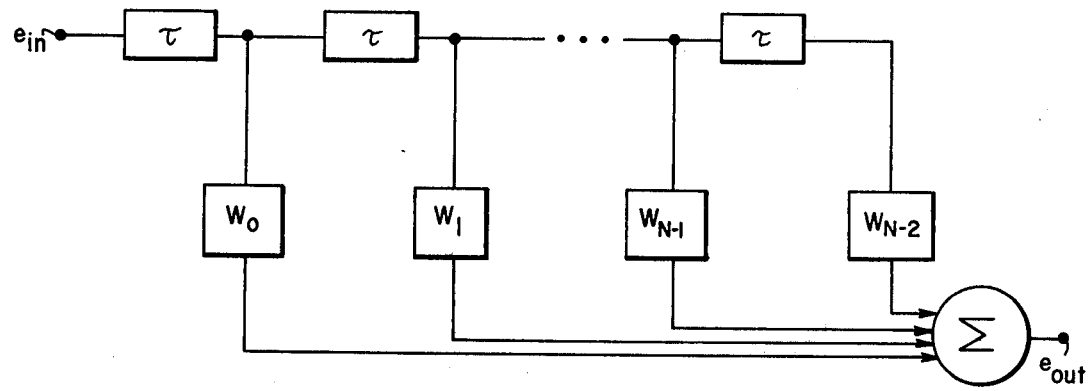
FIG. 1 is a schematic illustration of a prior art simultaneous summation type of circuit as may be implemented in a CTD device.
Figure 2:
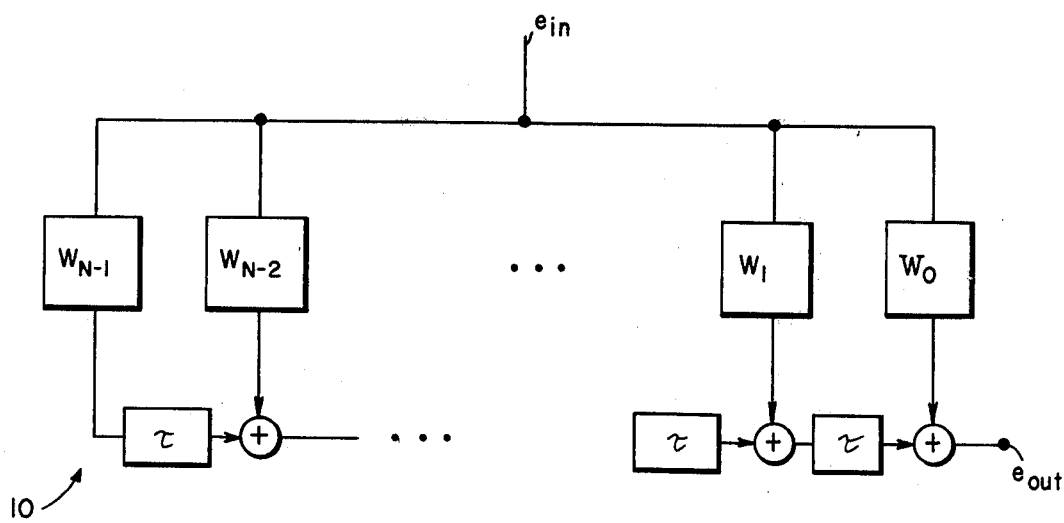
FIG. 2 is a schematic illustration of an implementation of a "progressive summation" technique which may be implemented in a CTD type device in accordance with the invention.

The present invention relates to a technique termed "progressive summation" of analog signals utilizing a parallel-in/serial-out (PI/SO) CCD structure, for replacing the conventional "simultaneous summation" of analog signals in prior art serial-in/parallel-out (SI/PO) structures. The latter type of structure is shown in FIG. 1 of the drawings and has been discussed hereinabove with reference to the prior art FIG. 2 is a schematic diagram, partly in block form, illustrating the technique of "progressive summation" of the invention, as may be employed for implementing a transversal filter or correlator. The input signal, $e_{in}$ is applied in parallel to each of a predetermined number N of multiplicative weighting circuits designated $W_0$, $W_1, \ldots W_{N-1}$. The delay and add structure designated 10 includes a succession of equal-time delay units labeled $\tau$ and an equal number of summing circuits labeled "+". The input signal $e_{in}$ is supplied as time ($\tau$)-spaced samples (and may be derived from an analog input signal by known sampling technique, the rate $\tau$ being determined by the frequency of the signals to be filtered and/or correlated in accordance with known sampling techniques). Control means (not shown) causes the signals stored in the CCD shift register 10 to be advanced through the successive stages for the successive additions indicated at the same rate as the sampling rate of the input signal $e_{in}$. For present purposes and explanation of FIG. 2, the successive input samples $e_{in}$ are supplied at the time intervals of $\tau$, corresponding to the delay intervals $\tau$ of the shift register 10.

The operation of the circuit of FIG. 2 will now be apparent. Each signal sample is weighted in parallel by the weighting factors $W_0, W_1, \ldots W_N-1$ and supplied to a delay circuit $\tau$ in the case of the $W_{N-1}$ weighted sample, or to a summation circuit and thence to the adjacent, respective delay circuit $\tau$. By virtue of the shift rate $\tau$ corresponding to the successive sample rate $\tau$, the summation circuits sum the respective, presently applied weighted signal value with the value applied thereto from the next preceding delay circuit. That value itself will be a summation of a number of weighted sample values from, and corresponding to the number of, the respectively preceding weighting circuits, for the respectively corresponding preceding input signal samples. The resulting output signal, $e_{out}$ may be expressed as:

$$e_{out}(t) = \sum_{k=0}^{N-1} W_k e_{in}(t - k\tau)$$

where $W_k$'s are the weights, $N$ the number of weights, and $\tau$ the unit delay.

Figure 3:
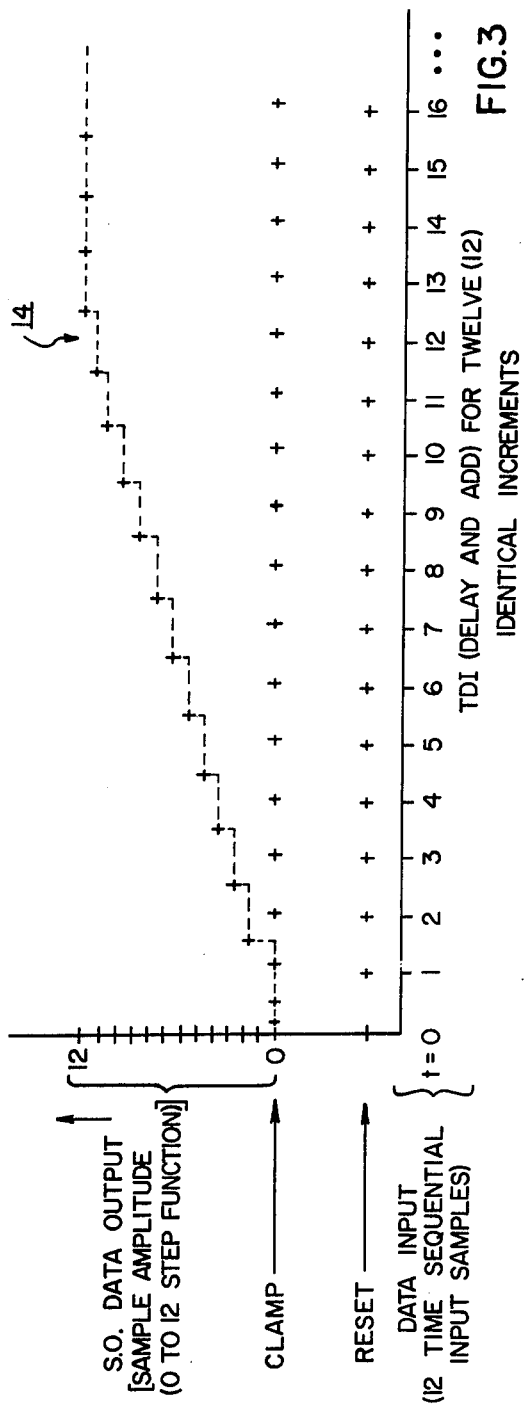
FIG. 3 is a plot of output samples for a TDI (delay and add) CCD operation.

FIG. 3 is a plot of the progressive summation, or TDI (delay and add) operation of the circuit of FIG. 2 and particularly wherein 12 time sequential input samples of the identical magnitude, are supplied as the input $e_{in}$ and the weighting factors $W_0$ through $W_{N-1}$ are identical. The output waveform 14, accordingly, comprises a stepped or incremental waveform composed of 12 identical increments increasing from the clamped value of "0". The clamped and reset values are discussed hereinafter, but are known functions in the operation of CCD devices. FIG. 3, therefore, is not indicative of a practical, actual operation of the circuit of FIG. 2 as a filter or otherwise, but merely is illustrative of the stepped function which results from the progressive summation; unity weights and identical signal sample values have been selected to emphasize this progressive summation operation. Moreover, whereas in a typical transversal filter or correlator, a minimum of 20 parallel signal sample inputs and corresponding weighting factors are employed, and hence 20 steps would be seen in the waveform of FIG. 3, only 12 have been shown for this illustrative purpose. Where more than 12 delay stages are provided, as in FIG. 2, the conditions illustrated in FIG. 3 imply that subsequently to the twelfth input sample, the identical amplitude in the CCD shift register 10 of FIG. 2 remains in the successive time periods 13, 14, . . . , through to producing the output $e_{out}$.

Accordingly, FIG. 3 is believed helpful in explaining the mathematical function of Equation (1) above in relation to the structure of FIG. 2. The output contribution from undelayed but $W_0$ weighted signal is $W_0 \times e_{in}(t)$, where ($t$) is the time of the filter output. The output contribution weighted by $W_1$ was sampled at time ($t-\tau$) due to the one $\tau$ delay it experiences before summation to give $W_1 \times e_{in}(t-\tau)$. In like manner, the output contribution weighted by $W_k$ (the $k^{th}$ weight) was sampled ($k\tau$) earlier at time ($t-k\tau$) due to the $k$delays of $\tau$ each to give $W_k \times e_{in}(t-k\tau)$. All such contributions are then summed progressively in the parallel entry delay structure of FIG. 2 by virtue of the principle of linear superposition. FIG. 3 illustrates the progressive summation of 12 equal parallel charge injections from an empty CCD shift level to the level where all the successive outputs contain the same progressive charge summation of 12 equal increments (i.e. level 12). Thus, the final summed output has the same formula as given above.

Figure 4:
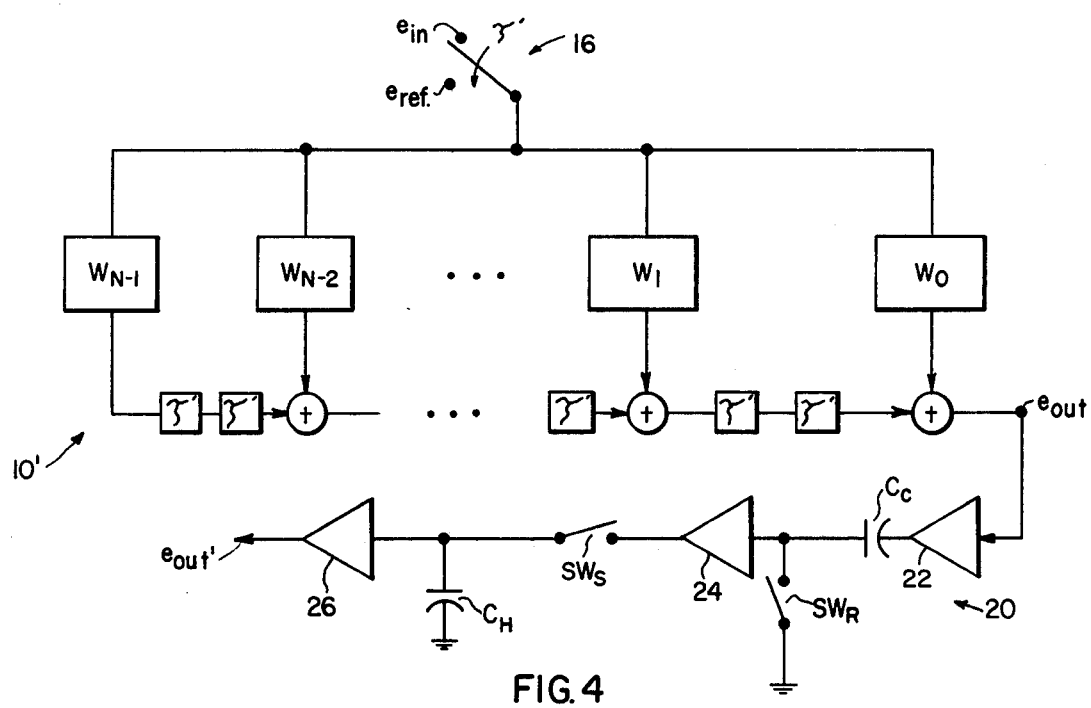
FIG. 4 is a circuit schematic similar to that of FIG. 2, modified to include ECDS (extended correlated double sampling) techniques.

The simplified schematic of FIG. 4 serves as a basis for explaining the application of extended correlated double sampling (ECDS) to the transversal filter implementation of progressive summation in accordance with the present invention. In FIG. 4, switch 16 is alternated between the input signal $e_{in}$ and a reference signal $e_{ref}$ to supply alternate samples of the signal and the reference in parallel to the same weighting circuits as shown in FIG. 2. The CCD shift register 10' of FIG. 4 now includes two delay stages, each of duration $\tau'$; preceding each summation circuit. The switch 16 is switched at the rate $\tau'$, initiating with the sample of the reference $e_{ref}$ to supply alternate pairs of $e_{ref}$ and $e_{in}$ signal samples in the successive delay stages $\tau'$. The output signal $e_{out}$ from the CCD shift register 10' is supplied to an analog reconstruction circuit 20 which accomplishes the ECDS function.

From the preceding discussion of FIG. 2, it is apparent that in FIG. 4, the same "progressive summation" of the alternating, successive signal and reference samples occurs in the structure of FIG. 4 such that $e_{out}$ includes in alternate time intervals the weighted summation function of FIG. 1 for each of the input signal samples and the reference value samples. Typically, $e_{ref}$ is selected as AC zero.

It is significant to note that the weighted signal sample charge packets for each of the input and reference signals, as they progress down the CCD shift register channel 10', experience identical residence times in the successive shift register stages. Moreover, they are subjected to the same non-uniformities of the weighting (multiplication) functions and to the same non-uniformities of thresholds and leakage currents within the CCD shift register 10'.

Circuit 20 receives these alternate reference and signal output values, as weighted and summed, in corresponding, alternate time intervals. During the time interval of receipt of a reference sample, switch SWR is closed and a voltage is developed on the clamp capacitor $C_c$ corresponding to the amplitude thereof. Switch $SW_R$ then is opened and switch $SW_S$ closed. The related, weighted and summed signal sample then is supplied to amplifier 22 and its value is differenced with the value of the reference signal stored on clamp capacitor $C_c$, such that the difference value only thereof is supplied through amplifier 24 and the closed switch $SW_S$ to be stored on holding capacitor $C_H$. The value stored on holding capacitor $C_H$ then is supplied through amplifier 26 as $e_{out}'$. It follows, therefore, that the errors in the weighted and summed output signal sample $e_{out}$ are cancelled by the differencing function in relation to the weighted and summed reference output signal and, thus, that the abovementioned sources of errors are accordingly eliminated in the output signal $e_{out}'$.

Figure 5:
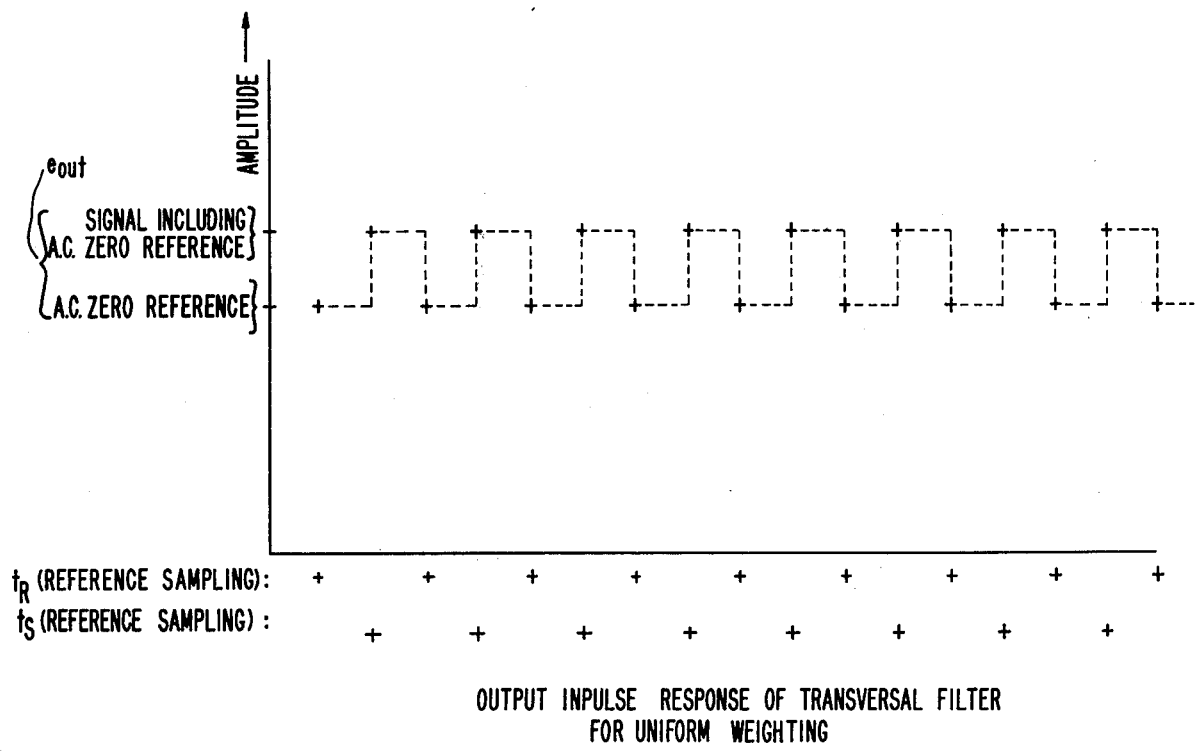
FIG. 5 is a plot of output signals representing the output impulse reponse of a transversal filter as in FIG. 4 with uniform weighting.

FIG. 5 is a plot of the output impulse response of the transversal filter of FIG. 4 for uniform weighting — i.e., the weights $W_0$ through $W_{N-1}$ are all of uniform weights. The "impulse response", of course, implies the single pulse response of the filter. Accordingly, for a single input sample $e_{in}$ and a single reference sample $e_{ref}$, the sample values indicated by the "+" for the successive reference and signal sampling times $t_r$ and $t_s$ shown in FIG. 5 will be obtained as the output $e_{out}$. The higher level represents the signal output, including the AC zero reference which is part of the input signal $e_{in}$ and as the lower level output samples, the AC zero reference. Thus, for the conditions stated of a single input reference and signal pulse, and for uniform weighting, the output response of the filter is seen to comprise alternate output samples of the AC zero reference level and the signal, including the AC zero reference level.

Figure 6:
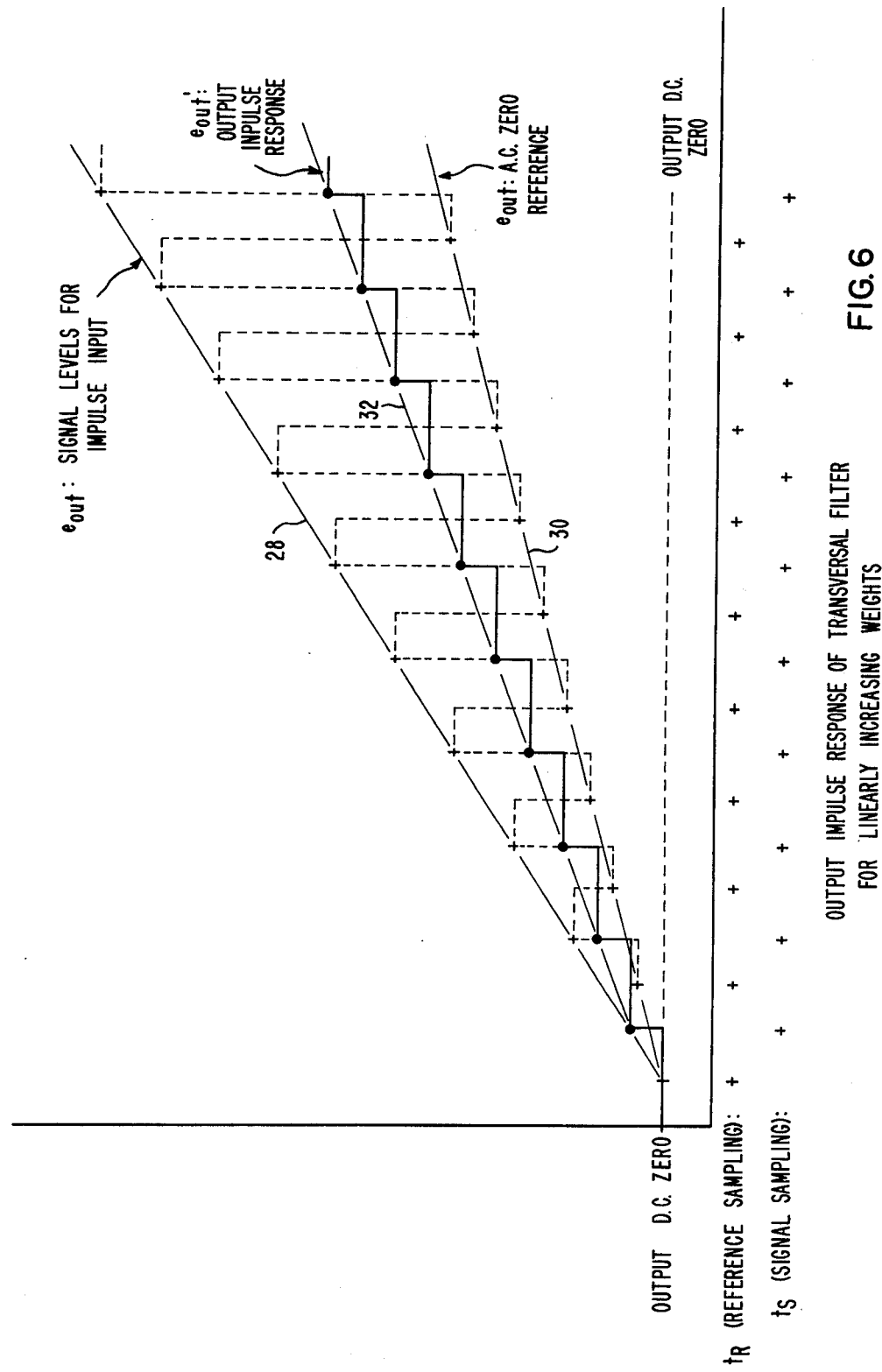
FIG. 6 is an output sample plot representing the output impulse response of a transversal filter as in FIG. 4 for linearly increasing weights.

FIG. 6 then illustrates the output impulse response of the transversal filter of FIG. 4 for linearly increasing weights — implying that the weights from $W_0$ to $W_{N-1}$ increase by equal increments. For the same condition of a single input signal sample $e_{in}$ and a reference sample $e_{ref}$, there results the output impulse $e_{out}$ identified in FIG. 6, the output signal levels being shown as "+" values defining a straight line sloping locus 28 and likewise the AC zero sample values also identified by (+) defining a locus comprising a straight line 30.

FIG. 6 also illustrates the function of ECDS. Specifically, the differencing of the AC zero reference samples (30) and the output signal level samples (including AC zero reference) defined by locus 28 result in the final output impulse $e_{out}'$ of the system identified at locus 32, the individual sample outputs being shown as small circles in a step function defining the locus 32 of the output impulse response $e_{out}'$.

Figure 7B:
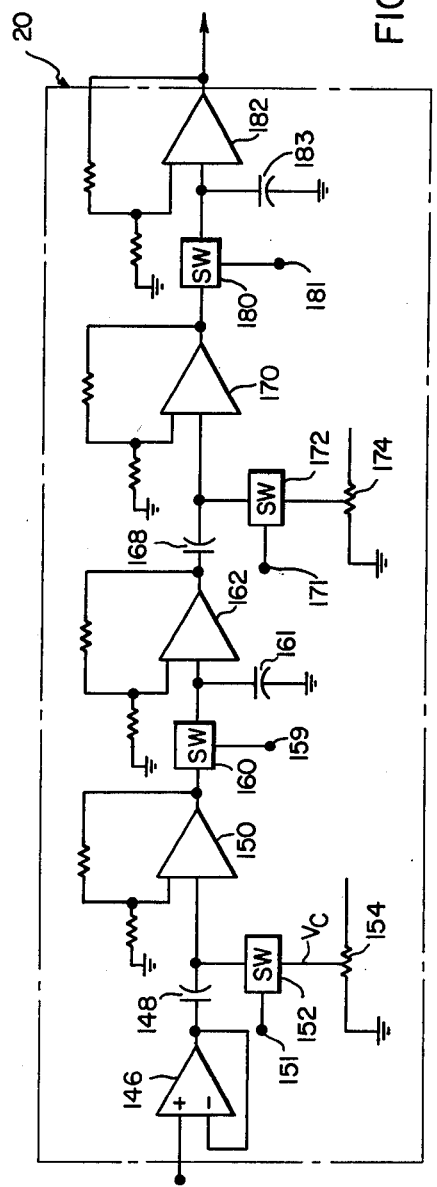
FIG. 7B is a detailed schematic of circuit 20, shown in FIG. 4.

FIG. 7A is a more detailed circuit schematic of the signal and reference sampling switch 16 and the weighting functions $W_0$ through $W_{N-1}$ of FIG. 4, and in addition a CCD shift register 50 corresponding to the delay and add structure 10' of FIG. 4. FIG. 7B, moreover, shows a circuit for performing combined ECDS and CDS functions. FIG. 8A through 8I are waveforms which will be used to explain the operation of the circuit of FIG. 7. Initially, however, it is believed beneficial to consider somewhat further, certain aspects of ECDS.

From the well-known function of charge propagation in a CCD, it will be appreciated that certain sources of noise and/or errors in the output charge packet exist. These include non-uniformities of threshold and leakage current conditions within the successive wells of the CCD channel through which the charge packet propagates, and also bias errors such as may occur from drifting of the biasing sources. Compensation of these sources of error must be provided to achieve desired linearity and accuracy. The technique of ECDS provides the necessary correction for these errors. In general, and as discussed in relation to FIG. 4, ECDS provides for alternately injecting samples of the input signal and a reference level signal whereby the successive signal samples, or charge packets, are separated by the reference level signals, or charge packets. The reference level signals may be visualized as affording sample-to-sample isolation; equally valid is the visualization of same as affording isolation cells surrounding each signal cell. The reference signal level need not be alternated with all of the data sample signals, if reduced sample-to-sample isolation is acceptable, thus permitting only one reference signal for every predetermined number of signal samples instead to be employed. The following discussion, however, assumes that alternate reference and signal samples are propagated down the CCD channel.

The only requirement on any auxiliary signal, i.e., the reference signal, carried in the isolation cells is that it not contribute a varying amount of charge to the succeeding data-carrying stages, which then becomes indistinguishable from the desired data. Any DC reference level fulfills that requirement, but a specially useful DC reference corresponds to the AC zero signal level. In this case, both the reference AC zero and the analog signal with reference bias appear sequentially interleaved at the CCD output.

Differencing the "reference only" and "signal plus reference" levels via the "clamp-sample-hold" technique of "extended correlated double sampling" (ECDS) then yields the desired error correction. Since both the "reference only" sample and "signal plus reference" sample follow the same path, they both interact with the same electrodes and thus give outputs determined by the same set of threshold voltages. Therefore output subtraction cancels any effects of MOS threshold non-uniformities and biasing errors with reduced sensitivity to leakage current non-uniformities. For applications where both samples dwell equally long at every point along their path, the leakage charge accumulated in both samples is identical and cancels exactly when the two samples are differenced at the output.

When the alternate reference level and signal level samples are employed, the sample-to-sample isolation above noted affords a further significant advantage in the reduction of crosstalk between successive signal samples. Specifically, the sample-to-sample isolation, $\epsilon$, as referred to the CCD, may be defined by the relative signal content of a CCD output charge packet:

$$\epsilon = \frac{\text{charge remaining from original signal sample}}{\text{charge added from preceding signal charge packets}}$$

Thus, ε is a measure of the extent to which one signal charge packet remains free from charge contributions from preceding signal charge packets corresponding to other independent samples of the signal. (The related phenomenon of crosstalk between signal samples occurs when a parallel in/serial out (PI/SO) CCD is used in a multiplexer.) Inadequate sample-to-sample isolation most generally results in degraded signal processing performance.

The circuit of FIG. 7 will be explained with reference to the waveforms of FIGS. 8A through 8I.

In FIG. 7A, the V input signal ($e_{in}$) is applied to the input signal node 30 and the V reference level signal ($e_{ref}$) is derived from the DC potential shown as a ground terminal. Transistor $SW_S$ is the signal sampling switch and transistor $SW_R$ is the reference level sampling switch, these transistor switches respectively being rendered conductive in alternate time intervals by the multiplexing signals X and $\overline{X}$ applied thereto through diode couplers 34 and 36. As noted, signals X and $\overline{X}$ are alternately enabling for their respective transistors so as to provide alternate signal and reference level signal samples. The samples are coupled through capacitor 38 and applied through biasing resistor divider 39, 40 to an input of an operational amplifier 42. Resistor 44 then receives the output of the amplifier 42 so as to apply these alternately selected signal and reference level signal samples to output line 46 which corresponds to the output from switch 16 in FIG. 4.

As seen in FIGS. 8A through 8I, 4-phase clocking of the gate electrodes is employed. Moreover, the waveforms in the foregoing discussion assume that the output is derived during the $\phi_1$ clock interval.

For the charge packet propagation shown in FIGS. 8A through 8D, it is seen that $\phi1$ goes high or repulsive and, after $\phi2$ goes high or repulsive (thereby isolating the $\phi1$ electrode) $\phi1$ again goes low or attractive. $\phi4$ at this instant, however, is high or repulsive and hence the charge packet is confined under the $\phi3$ electrode by both $\phi2$ and $\phi4$ being high. Moreover, the $\phi1$ electrode well, though attractive, now is isolated from the charge being propagated and a reference level sensed from the $\phi1$ electrode will be indicative of that condition. From FIG. 4L, a first clamp signal now is generated to clamp the voltage of a memory capacitor to the current $\phi1$ level. The voltage developed in the memory capacitor will include the Nyquist noise from the sampling, or clamping function.

The charge subsequently propagates from $\phi_3$ to $\phi_1$: due to $\phi_4$ becoming attractive and $\phi_3$ going repulsive followed by $\phi_4$ going repulsive with $\phi_2$ also repulsive to confine the charge packet under the $\phi_1$ gate electrode. Under this circumstance, the maximum charge packet is confined under the $\phi_1$ electrode — the appropriate time for sampling of that signal level. Accordingly, and as seen in FIG. 8G, a sample voltage pulse is generated for sampling the output potential level of the $\phi_1$ electrode during this interval (i.e., while the maximum charge is confined under $\phi_1$). The signal sample then is compared in amplitude with the clamped voltage sensed from the $\phi_1$ electrode in the earlier interval when the $\phi_1$ electrode was isolated from the propagating charge package, and a difference signal is generated. Since Nyquist noise associated with the output reset operation is stored and remains essentially unchanged through the sample operation, the result difference then provides an output signal level which represents the true signal level, independent of the Nyquist noise.

FIG. 8E illustrates the charge distribution levels under the $\phi_1$ electrode for the signal pattern of alternate signal and reference level samples, in accordance with ECDS. As noted, the reference level conveniently is AC zero. Accordingly, the sampling function performed in accordance with the sampling waveform of FIG. 8G provides alternate signal level and reference level samples. The reference sampled in a first shift cycle of the CCD readout is stored on a memory capacitor and compared during the next cycle with the signal level sample. The difference therebetween then is taken as the output signal level sample from the CCD. It should be appreciated in this context that the Nyquist noise rejection is accomplished within each shift cycle of the CCD (i.e. as defined by the completed cycle of $\phi_1$ through $\phi_4$ for shifting a charge packet through and from one stage and into the next). Hence, each of the reference level sample and the signal level sample are corrected individually for the Nyquist noise error by the CDS technique.

The significance of a CDS will be readily appreciated when it is realized that each of the reference level and signal level samples propagates through the identical paths of the CCD. Hence, for a serial input charge injection as shown in FIG. 4A each charge packet — both reference and signal — has the same residence time in each successive stage of the CCD shift register 10 and each is subjected to the same non-uniformites of threshold levels and leakage current and bias variations. The differencing of the reference and signal level samples of two successive cycles provides for elimination from the final output signal sample of errors occurring due to threshold and leakage current non-uniformities and bias level variations. Thus, full and complete correction for these sources of error is achieved by ECDS. Moreover, ECDS is fully compatible with CDS. The distinction of ECDS correcting for errors from the input to the output of the CCD as contrasted to CDS correcting only for Nyquist noise sampling at the output of any form of analog charge output device, as well, will be readily seen.

Switch 160 receives the "first sample" signal waveform of FIG. 8G and, accordingly, opens switch 160 to sample the signal level then on electrode $\phi_1$. For the combined ECDS/CDS system here under consideration, and comparing FIG. 8G with FIG. 8E, the first sample will be of a reference level. That sampled reference level is coupled through capacitor 148 and thus differenced with the Nyquist and bias ($V_C$) value signal stored on capacitor 148, and then is supplied through amplifier 150 to switch 160, corrected for the Nyquist sampling error. Switch 160 receives the "first sample" signal waveform of FIG. 8G and supplies the Nyquist-correct reference level sample to the common node of memory capacitor 161, for storage thereon, and to the input of operational amplifier 162. The described CDS clamping and sampling operations repeat for each transfer cycle as seen in FIGS. 8F and 8G. Accordingly, the Nyquist noise level is again established on capacitor 148 and upon sampling of the signal level of FIG. 8E (i.e., in the next transfer cycle) the Nyquist noise-corrected, sampled signal level is coupled through operational amplifier 150 to switch 160. Again, switch 160 is closed by the "first sample" pulse waveform of FIG. 8G and the Nyquist-corrected signal level sample is stored on the storage capacitor 161.

In FIG. 7B, switch 152 receives the first clamp signal of FIG. 8F at its input terminal 151. When the first clamp is low, switch 152 is open. At the (h9gh) time of the first clamp, switch 152 closes to apply the DC signal bias level $V_C$ to capacitor 148. The output signal sensed at $\phi_1$ thereof is supplied across the bias established on capacitor 148 to operational amplifier 150. Note in this regard that the signal which is coupled to and stored across capacitor 148 represents the Nyquist noise resulting from this sampling function.

Simultaneously with the next "first clamp" (FIG. 8F) following a reference level sampling, the second reference level clamp (FIG. 8H) occurs; the "second reference clamp" is applied to terminal 171 of switch 172 to close same. A circuit thus is completed to transfer the voltage stored on capacitor 161 (i.e., the reference level voltage) to capacitor 168 for storage thereon.

Switch 180 now receives and is closed by the (AC) true signal sample waveform of FIG. 8I (occurring in the alternate cycles of the "second reference clamp" of FIG. 8H to complete a circuit from the storage capacitor 161 through amplifier 162, capacitor 168, and amplifier 170 to storage capacitor 183. The signal sample level on capacitor 161 thus is differenced against the reference level stored on capacitor 168 and the difference signal stored on storage capacitor 183. Hence, operational amplifier 182 provides an output signal corrected both in accordance with CDS and ECDS.

Referring again to FIG. 7A, the weighting circuits $W_0$ through $W_{N-1}$ of FIGS. 1 and 4 are shown in more detail, with particular reference to the weighting circuit $W_0$, the remainder being identical. Each such weighting circuit, such as $W_0$, includes a series connection of two resistors respectively labeled $R_0$ and $R* - R_0$ connected in series between the output line 46 and ground. The series junction thereof is connected through an AC coupling capacitor C to a DC bias circuit including resistors $R'$ and $R''$. The function of resistors $R'$ and $R''$ is to establish an appropriate DC bias level such that AC signals can be propagated in a CCD device, the latter being by its very nature a single polarity type device. The DC bias level accordingly sets a reference level about which an AC signal may vary to permit AC operation of a CCD device. The weighting circuit is merely illustrative and laternatives may be used, especially for providing both positive and negative weighting.

The weighting constant in accordance with the series resistors $R_0$ and $R* - R_0$ may be expressed as:

$$W_k = R_k/R$$

The provision of the resistors of the type designated $R* - R_0$ is to afford a common resistance value $R*$ for each of the resistor divider legs for the weighting function in the respective weighting circuits $W_0$ through $W_{N-1}$. It is to be understood that the DC bias circuit of FIG. 7A is repeated for each of the series junction outputs of the respective weighting resistors of the weighting circuits and, moreover, that the respective outputs of these weighting circuits are applied to the corresponding inputs of the CCD shift register 50.

Specifically, shift register 50 has a number of pairs of stages, the paired relationship being designated by $\alpha,\beta$, and a number of such pairs of stages being designated by the subscripts 0, 1, ..., (N-1) corresponding to the weighting circuits $W_0$ through $W_{N-1}$. The stages labeled $\alpha$, moreover, have associated therewith parallel charge injector circuits, respectively, labeled $CI_0$, $CI_1$ ... $CI_{N-1}$. It will be understood that the reference signal samples are injected by the injector circuits CI simultaneously into the $\alpha$ stages of the respectively corresponding pairs of stages and subsequently shifted to the $\beta$ stages for injection of the signal samples in the next shift interval into the $\alpha$ stages. These samples, of course, are the weighted samples provided from the weighting circuit outputs. It, moreover, will be appreciated that the respective $\alpha,\beta$ pair relationship is maintained in the subsequent shifting of the charge packets corresponding to the parallel injected, weighted signal samples, throughout the shifting functions of the register 50.

PARALLEL SIGNAL INJECTION

Parallel injection must be low in noise if signal enhancement is to be realized. The following explains how such a requirement may be satisfied in a CCD system.

A significant source of noise in charge injection arises from the uncertainty associated with the input capacitance $C_{IN}$ and particularly input capacitance non-uniformities $\Delta C_{IN}$. Since input capacitance non-uniformities ($\Delta C_{IN}$) comprise the principal contribution to charge uncertainty in the injection it follows that for a large value of $C_{IN}$:

$$\Delta C_{IN}/C_{IN_k} <<< 1.$$

Therefore, to improve upon the accuracy and hence reduce the uncertainty of charge injection, a large value of input capacitance $C_{IN}$ is desired, requiring in turn large physical dimensions of the input capacitance. The large physical dimensions introduce a further problem, discussed hereinafter in detail, as to adequate speed of propagation of the charge from under the now large capacitance for injection into the CCD shift register. A solution for that problem is now set forth.

Figure 9A:
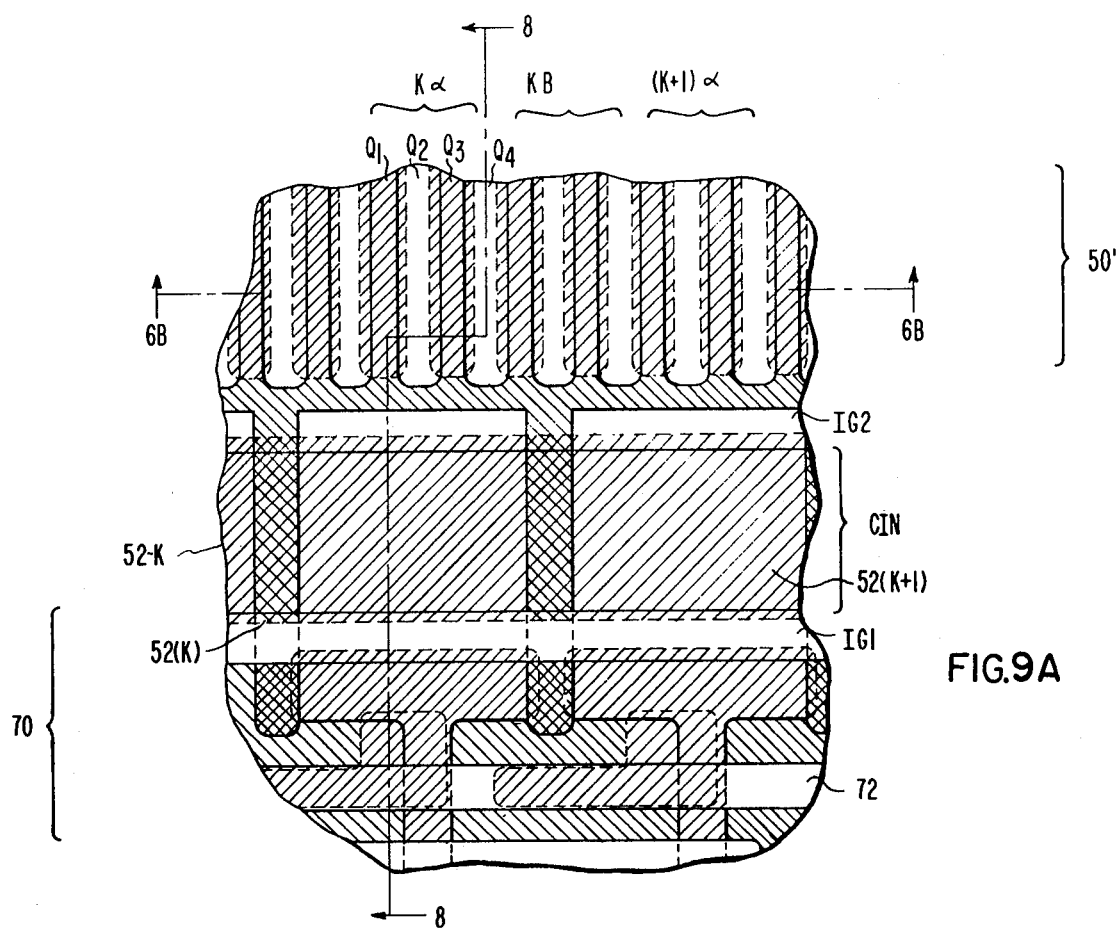
FIG. 9A is a plan view of a CCD shift channel and associated parallel charge injector structure.

FIG. 9A is a plan view of a portion of a CCD monolithic structure including a CCD shift register 50' with the CCD channel having stages $K\alpha$, $K\beta$, $(K+1)\alpha$, .... The individual gate electrodes, arranged for four-phase clocking are illustrated at $\phi_1$ through $\phi_4$ and are included at each of the successive stages. The portion 70 comprises a stabilized charge injector for injecting charge into the CCD shift register 50'.

The input gate 52(K) of stage (K) having the effective capacitance $C_{IN(K)}$ is seen in FIG. 9A to comprise a relatively large gate electrode 52(K). The gate 52(K+1) as well is seen corresponding to the next stage (K+1). Channel stop 53 separates and thereby isolates the adjacent gate electrodes, and hence the capacitances, to avoid any interaction therebetween. Channel stop 53 also extends in a "T" type configuration as seen in the drawing to include a portion extending from left to right above the conductor IG2. Gate conductor IG1 is also seen in the drawing. The areas V(K)+ and V(K+1)+ are the signal input gates and may be visualized as corresponding to the arrows at the inputs to the injectors $I_0$ to $I_{N-1}$ in FIG. 7A. Regions labeled PDIN(K) and PDIN(K+1) are the input diffusions, to be discussed. Element 72 is an aluminum stripe which extends across the areas PDIN and electrically ties them together.

Figure 9B:
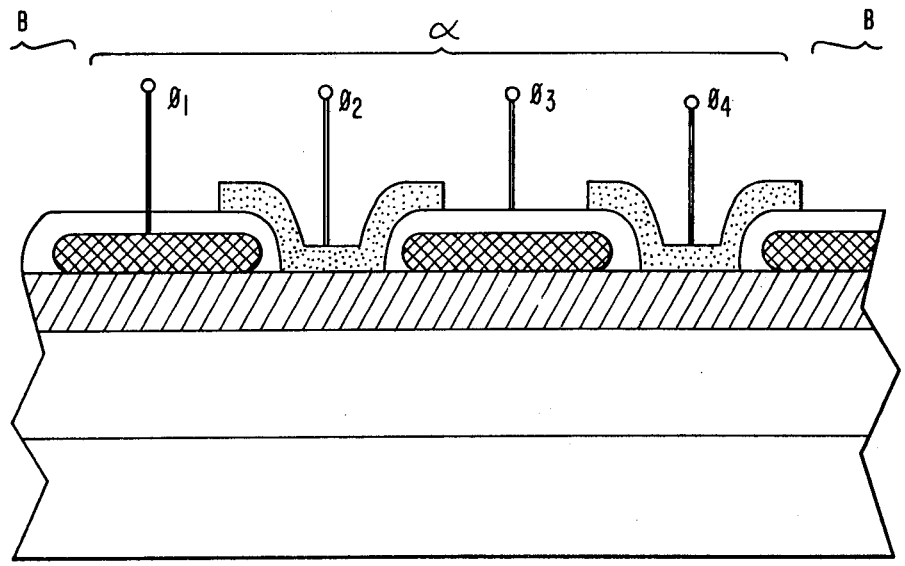
FIG. 9B is a cross section taken along the line 9B—9B of FIG. 9A and showing components of the CCD shift channel.

FIG. 9B illustrates a cross-sectional view taken along the line 9B—9B in FIG. 9A to permit the reader to more readily visualize the arrangement of the successive electrodes $\phi_1$ to $\phi_4$ of the successive pairs of stages $\alpha,\beta$ as exist in the CCD shift register 50'.

Figure 11:
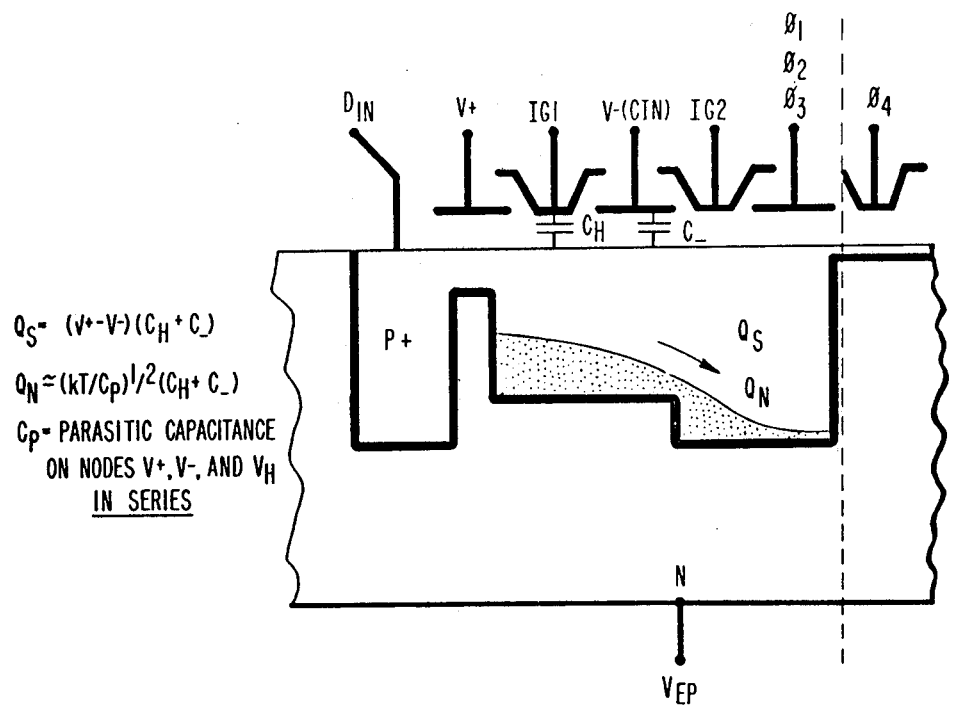
FIG. 11 is a schematic view through a cross section of an SCI for indicating the relationship of electrodes and the waveforms of FIGS. 10A through 10D and resulting potential well conditions.
Figure 12:
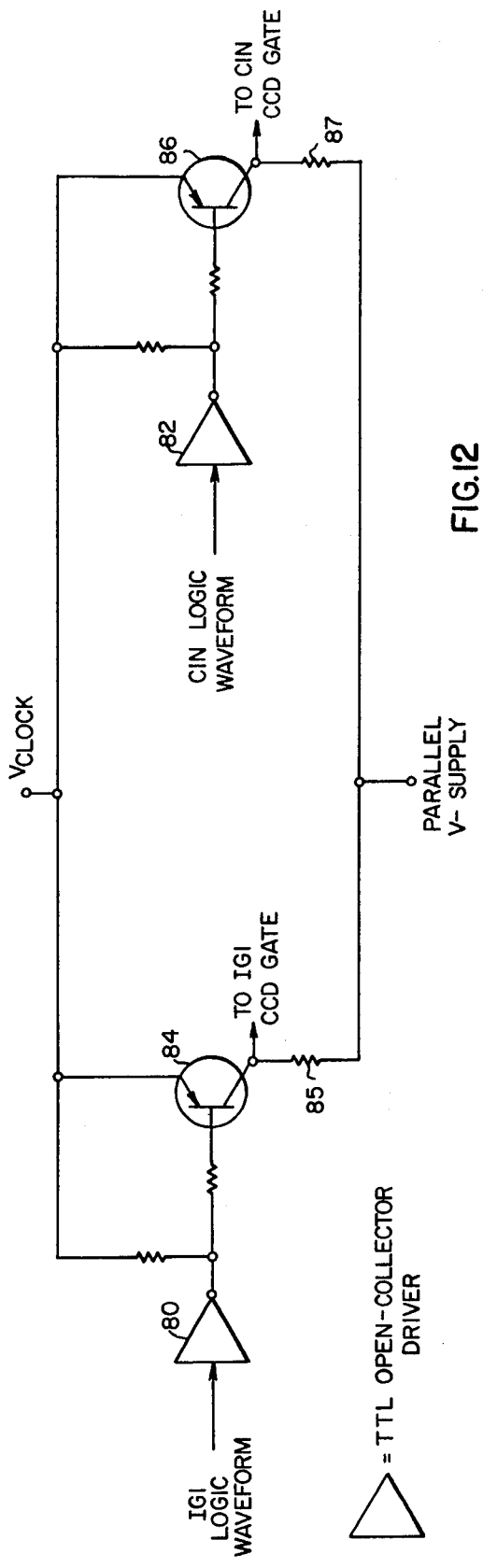
FIG. 12 is a schematic of a circuit for generating the waveforms of FIGS. 10B and 10C.

The injection operation and the shift operation of the structure of FIGS. 9A and 9B will be more readily appreciated with reference to the waveforms of FIGS. 10A through 10H, the schematic cross-sectional illustration of FIG. 11, the latter indicating in essence a cross-sectional view along the line 11—11 in FIG. 9A, and a driving circuit the schematic of which is shown in FIG. 12.

In FIG. 9A, the regions PDIN correspond to the region P+ with the input $D_{IN}$ in FIG. 11, the region P+ acting as a source of minority carriers during the refill operation as seen in FIG. 11 and subsequently as a drain during the scupper period. The signal input is V+ in FIG. 11 and is correspondingly labeled for the stages (K) and (K+1) in FIG. 9A.

For reasons already explained, the capacitances CIN are of relatively large area, for example 70 microns in width and 56 microns in length, as those relative dimensions are illustrated in FIG. 9A. While this affords an improvement in noise reduction during charge injection, it creates a problem as to achieving adequate speed of propagation of the injected charges from under these large area capacitances into the CCD shift register. In that regard, from FIG. 9A it is to be appreciated that the charge propagates from the capacitor, for example, for the stage (K) into the gate electrodes $\phi_1$, $\phi_2$ and $\phi_3$ of the (K$\alpha$) stage. As will be seen, gate electrode $\phi_4$ creates a barrier during the injection of the charge into this region of the shift register stage.

To achieve adequate speed of propagation of the charges from under the input gate capacitances, successive gates IG1 and V− are provided, which effectively separate the length of the gate capacitances to permit successive pushing of the charge packet from under each such capacitance into the respective stage of the shift register.

With reference to FIGS. 10B and 10C, it will be seen that the signals IG1 and CIN become attractive simultaneously during the refill to attract charges from the P+ diffusion into the input capacitance. This flow of the charges would be into the area, or region, underlying the gates IG1 and V− in FIG. 11. Excess charges are scuppered out from this region down to the level of the signal V+ and thus back into the P+ region which now acts as a drain.

Parallel charge injection occurs in each successive shift cycle for TDI operation, and the interval during which it occurs is shown in relation to FIG. 10A through FIG. 10H. For convenience, the letter descriptions in the following refer both to the waveforms of FIGS. 10A to 10H and the gate structure of FIG. 11. IG1 goes high and therefore repulsive, pushing charges into the neighborhood of CIN. IG2 has become attractive, as have $\phi_1$, $\phi_2$, $\phi_3$. In succession, CIN and IG2 become repulsive, injecting the charges into the stage, then blocking off the parallel structure to permit a serial shift of the charge packets.

At the time of the first parallel injection, $\phi_4$ is repulsive and creates a barrier; $\phi_1$, $\phi_2$ and $\phi_3$ are attractive; and therefore the injection is achieved.

Again referring to FIGS. 10A through 10H, during the interval labeled "single serial shift", the injected charge is moved forward from the $\alpha$ stage to the $\beta$ stage. Specifically, $\phi_1$, $\phi_2$ and $\phi_3$ successively become repulsive, and $\phi_4$ now is attractive, causing the charge to advance to the last portion of the $\alpha$ stage, i.e., that under the $\phi_4$ electrode. $\phi_1$ becoming attractive followed by $\phi_4$ becoming repulsive then corresponds to the charge packet moving into the $\beta$ stage of the $\alpha/\beta$ pair. Simultaneously, of course, charge injection is occurring into the $\alpha$ stage. For all except the first $\alpha/\beta$ stage pair, each injection results in addition to the existing charge in the $\alpha$ stage of the pairs — alternately being the reference and the signal sample.

As before noted, there is a difficulty with a large input capacitance of assuring adequate speed of propagation of the charges. This is overcome in accordance with the effective electrical dividing of the capacitance by the special electrical pulsing technique relating to the signal waveforms IG1 and CIN. In essence, it is desired that the electrodes create a common potential while the charge is initially set up in the underlying region, but then provide two successive pushes of the charges from that region during the charge injection operation.

This is accomplished in accordance with the circuit of FIG. 12. The IG1 and CIN logic waveforms are applied to TTL open collector drivers 80 and 82, respectively, the outputs thereof driving PNP transistors 84 and 86, respectively. The transistors 84 and 86 are connected at their emitters to a clock source and at their collectors to a parallel V− supply through resistors 85 and 87, respectively. During set-up of the charge in the common regions of IG1 and CIN, transistors 84 and 86 are effectively turned off by the corresponding logic waveforms applied thereto and, as a result, the outputs from their collectors through the respective resistors 85 and 87 are tied to the parallel V− supply, creating a common low-noise potential condition under these gates.

When IG1 goes high, (FIG. 10B), transistor 84 becomes conductive and hence its output at its collector terminal raises to the level of the clock: the clock presents a high repulsive level, producing the first push function. Subsequently, CIN goes high, turning on transistor 86 and raising its collector output across resistor 87 to the high repulsive level of the clock and providing the further push function.

In conclusion, the foregoing has disclosed the technique of "progressive summation" of analog signals in a CCD device suitable for implementing a correlator or transversal filter. Special techniques and circuit provisions for use therein are as well set forth and particularly the ability to utilize techniques both of ECDS and CDS in conjunction with the outputs from the CCD device. Moreover, special techniques for parallel charge injection, of great importance to assure that noise levels developed in the injection process are minimized to afford accuracy of the resulting output signals, are disclosed.

Numerous modifications and adaptations of the "progressive summation" technique of the invention and of the specifically disclosed circuit embodiments in which that technique is implemented will be apparent to those of ordinary skill in the art, and thus it is intended to encompass all such modifications and adaptations of the invention within the true spirit and scope of the appended claims.

What is claimed is:
1. A system for progressive summation of analog signals, comprising:
   a charge transfer device having a plurality of successive stages, and means for shifting charge packets through said plurality of successive stages at a predetermined cyclic shift rate,
a plurality of charge injecting means respectively associated with at least selected ones of said plurality of successive stages, each said charge injecting means injecting a charge packet into a respectively corresponding selected one of said plurality of successive stages of said charge transfer device,
a plurality of signal processing means respectively associated with said plurality of injecting means,
means for supplying an input signal,
means for sampling said input signal and supplying said sampled input signal simultaneously and in parallel to each of said signal processing means in time sequence with said cyclic shift rate of charge packets through said stages of said charge transfer device,
said signal processing means simultaneously receiving said input signal sample in parallel and processing same, each thereof supplying a respective, processed signal sample to said respectively associated charge injector means, and
each of said plurality of charge injector means injecting a charge packet corresponding to said respective, processed signal sample from said processing means, into the respectively associated stage of said charge transfer device,
each of said selected stages of said charge transfer device receiving said injected charge packet simultaneously with the shifting thereinto of a charge packet from a preceding stage of said charge transfer device and summing said injected and shifted charge packets to produce a summation charge packet for shifting to the next successive stage of said charge transfer device, and
means for sensing a potential induced by each said summation charge packet from the last of said selected stages of said charge transfer device and producing a corresponding summation signal output sample corresponding thereto.

2. A system as recited in claim 1 wherein each of said signal processing means comprises a multiplicative weighting circuit.

3. A system as recited in claim 2 wherein each successive stage of said charge transfer device has a multiplicative weighting constant signal processing circuit associated therewith, and wherein there are a plurality of N said stages, each said stage having a propagation delay time of $\tau$, and wherein the aforesaid multiplicative weighting signal processing circuits have respective weights $W_0, W_1, \ldots W_{(N-1)}$, the said system producing an output $e_{out}(t)$ as a function of time $(t)$ with respect to an input signal $e_{in}(t)$ in accordance with:

$$e_{out}(t) = \sum_{k=0}^{N-1} W_k e_{in}(t - k\tau).$$

4. A system as recited in claim 1 wherein said charge transfer device includes a plurality of successive, serially-connected pairs of stages providing for successive propagation of said charge packets through said plurality of serially-connected pairs of stages at the said cyclic shift cycle rate with respect to each of said stages, and wherein there is further provided:
a source of a reference level, and
said sampling means alternately samples said input signal and said reference level to provide a succession of alternate reference and signal samples to said signal processing circuits, whereby each said injector means, in alternate succession, injects charge packets corresponding to said processed reference and signal samples, said corresponding reference and signal sample packets propagating in said alternate, paired relationship through said successive stages of said charge transfer device and producing an alternate succession of reference and signal summation charge packets,
said sensing means senses the potentials induced by each said reference and signal summation packets and produces corresponding reference level and signal summation output samples, and there is further provided
analog circuit means selectively responsive to said alternate succession of reference and signal summation output samples of said sensing means for storing a value corresponding to the reference summation output sample and for differencing the signal summation output sample therewith to provide a difference summation value as the summation output signal of said system, said summation output signal thereby being corrected for threshold and leakage current nonuniformities and for biasing errors in said system.

5. A system as recited in claim 4 wherein each said stage of said charge transfer device comprises a plurality of electrodes, and there is further provided
clocking means providing a sequence of clocking signals to said electrodes of each stage for successively shifting a charge packet through each said stage and to a successive stage at said cyclic rate, said clocking means defining a clamping interval during which all charge packets are isolated from said sensing means and a sensing interval during which the summation charge packet is confined at said sensing means, in accordance with the sequence of clocking signals provided in each shift cycle, and wherein:
said sensing means senses the potential of a preselected one of said plural electrodes of said output stage, and is controlled by said clocking means to produce a clamp output during said clamp interval and a sample output during said sample interval, and
said analog circuit means includes storage means for storing the value of said clamp output from said preselected electrode of said output stage during said clamping interval and for storing the signal sample output from said selected electrode during said sampling interval, and means for determining the difference between the clamped output stored in said storage means and said signal level output to provide the difference therebetween as the output signal of said system, thereby removing components of noise from said signal output, contributed by said sampling function.

6. A system as recited in claim 5, wherein said sample output during said sampling interval in a first shift cycle comprises a reference level sample and the sample output in a next successive shift cycle comprises a signal sample, the output signal of said analog processing circuit thereby comprising the difference between the noise corrected output sample for said reference signal and the noise corrected output sample for said signal sample, to correct for both the effects of noise due to the sampling function and errors due to nonuniformities of threshold and leakage currents of said charge transfer device and said input and output circuitry in producing said output signal.

7. A system as recited in claim 1 wherein each said stage of said charge transfer device comprises a plurality of electrodes, and there is further provided:

clocking means providing a sequence of clocking signals to said electrodes of each stage for successively shifting a charge packet through each said stage and to a successive stage at said cyclic rate, said clocking means defining a clamping interval during which all charge packets are isolated from said sensing means and a sensing interval during which the summation charge packet is confined at said sensing means, in accordance with the sequence of clocking signals provided in each shift cycle, and wherein:

said sensing means senses the potential of a preselected one of said plural electrodes of said output stage, and is controlled by said clocking means to produce a clamp output during said clamp interval and a sample output during said sample interval, and said analog circuit means includes storage means for storing the value of said clamp output from said preselected electrode of said output stage during said clamping interval and for storing the signal sample output from said predetermined electrode during said sampling interval, and means for determining the difference between the clamped output stored in said storage means and said signal level output to provide the difference therebetween as the output signal of said system, thereby removing components of noise from said signal output, contributed by said sampling function.

8. A system as recited in claim 1 for performing transversal filtering of said input signal $e_{in}(t)$ in accordance with the said function.

9. A system in accordance with claim 1 for performing correlation of the said input signal $e_{in}(t)$ in accordance with the said function.

10. A system in accordance with claim 1 for performing autocorrelation of the input signal $e_{in}(t)$ in accordance with the said function.

11. A system for performing the function:

$$e_{out}(t) = \sum_{k=0}^{N-1} W_k e_{in}(t - k\tau)$$

where $e_{out}(t)$ is the output voltage to be produced as the said function of an analog input signal $e_{in}(t)$ as a function of time $(t)$, $e(t-k\tau)$ represents the $k_{th}$ sample thereof at successive time intervals, $\tau$, and $W_k$ represents multiplicative weighting constants for the respective samples $k$, where $k = 0, 1, \ldots (N-1)$, comprising:

a charge transfer device having N successive stages 0, 1, 2 ... (N−1) and means for shifting charge packets through said successive stages at a cyclic shift rate corresponding to a charge propagation time $\tau$ in each said stage thereof, (N) charge injector means respectively associated with said (N) stages of said charge transfer device, each thereof for injecting a charge packet into the respectively associated stage, (N) weighting means of weights $W_0, W_1, \ldots W_{(N-1)}$ connected to respectively associated ones of said (N) charge injector means, means for sampling an input signal $e_{in}(t)$ at successive intervals $\tau$, in timed relation to said cyclic shifting of said charge transfer device, said sampling means providing said input signal samples to said weighting means in parallel, and said charge injector means receiving the corresponding, weighted outputs of said respectively associated weighting means for injecting corresponding charge packets into the respectively associated stages of said charge transfer device, timed in relation to said cyclic shift rate thereof, each said stage of said charge transfer device substantially simultaneously receiving a propagating packet from a preceding stage and a charge packet injected by the injector means respectively associated therewith and summing the said propagating and injected charge packets for subsequent propagation thereof as a summation charge packet to a next succeeding stage of said charge transfer device whereby the summation charge packet in the last successive stage corresponds to the output signal $e_{out}(t)$ in accordance with the aforesaid function, and means for sensing a potential induced by each said summation charge packet in said last, successive stage of said charge transfer device, thereby to provide said output signal $e_{out}(t)$.

12. A system as recited in claim 11 for performing transversal filtering of said input signal $e_{in}(t)$ in accordance with the said function.

13. A system in accordance with claim 11 for performing correlation of the said input signal $e_{in}(t)$ in accordance with the said function.

14. A system in accordance with claim 11 for performing autocorrelation of the input signal $e_{in}(t)$ in accordance with the said function.

15. A method of progressive summation of analog signals through use of a charge transfer device having a plurality of successive stages and means for shifting charge packets through said plurality of successive stages at a predetermined cyclic shift rate, and a plurality of charge injecting means respectively associated with at least selected ones of said plurality of successive stages, each said charge injecting means injecting a charge packet into a respectively corresponding one of said plurality of successive stages of said charge transfer device, and a plurality of signal processing means respectively associated with said plurality of injecting means, comprising:

sampling an input analog signal in time sequence with said cyclic shift rate of charge packets through said stages of said charge transfer device, processing each said analog signal sample in parallel processing functions, supplying the parallel processed signal samples to respectively associated charge injector means for injecting charge packets corresponding to said respective, parallel processed signal samples into respectively associates stages of said charge transfer device for simultaneously summing said injected charge packet with a charge packet shifted thereinto from a preceding stage of said charge transfer device to produce a summation charge packet, shifting the summation charge packet to the successive stages of said charge transfer device, and sensing a potential induced by each said summation charge packet from the last of said successive stages of said charge transfer device and producing a corresponding summation signal output sample corresponding thereto.

16. A method as recited in claim 15 wherein said processing step comprises multiplicative weighting of said parallel signal samples.

17. A method of claim 16 wherein the output signal is the following function of the input signal:

$$e_{out}(t) = \sum_{k=0}^{N-1} W_k e_{in}(t - k\tau).$$

18. A method as recited in claim 15 further including cancellation of errors in the output signal, comprising:
alternately sampling said input signal and a reference level to provide a succession of alternate reference and signal samples injecting, in alternate succession, in charge packets corresponding to said processed reference and signal samples, and propagating same in alternate, paired relationship through said successive stages of said charge transfer device and producing an alternate succession of reference and signal summation charge packets,
sensing the potentials induced by each said reference and signal summation packets and producing corresponding reference level and signal summation output samples, and
determining the difference of the reference summation output sample and the signal summation output sample to provide a difference summation value as the summation out-put signal of said system, said summation output signal thereby being corrected for threshold and leakage current non-uniformities and for biasing errors in said system.

19. A method as recited in claim 18, wherein in each cycle, there is defined a clamping interval during which all charge packets are isolated from a sensing means and a sensing interval during which the summation charge packet is confined at the sensing means, in accordance with a sequence of clocking signals provided in each shift cycle, further comprising:
sensing the potential of a preselected one of said plural electrodes of said output stage, during said clamp interval and during said sample interval,
storing the value of said clamp output-from said predetermined electrode of said output stage during said clamping interval determining the difference between the stored, clamped output and the signal sample output from said predetermined electrode during said sampling interval, and providing the difference therebetween as the output signal of said system, thereby removing components of noise from said signal output, contributed by said sampling function.

20. A method as recited in claim 19, wherein said sample output during said sampling interval in a first shift cycle comprises a reference level sample and the sample output in a next successive shift cycle comprises a signal sample, the output signal of said analog processing circuit thereby comprising the difference between the noise corrected output sample for said reference sample, to correct for both the effects of noise due to the sampling function and errors due to non-uniformities of theshold and leakage currents.

* * * * *